United States Patent [19]

Adachi et al.

[11] Patent Number: 5,087,553
[45] Date of Patent: Feb. 11, 1992

[54] METHOD FOR TRANSFERRING PATTERNS ON SILICONE LADDER TYPE RESIN AND ETCHING SOLUTION USED IN SUCH METHOD

[75] Inventors: Hiroshi Adachi; Etsushi Adachi; Yoshiko Aiba, all of Amagasaki; Osamu Hayashi, Tokyo, all of Japan

[73] Assignee: Mitsubishi Denki Kabushiki Kaisha, Tokyo, Japan

[21] Appl. No.: 475,307

[22] Filed: Feb. 5, 1990

[30] Foreign Application Priority Data

Feb. 23, 1989 [JP] Japan .................................. 1-44326

[51] Int. Cl.$^5$ ........................... G03F 7/30; G03F 7/40
[52] U.S. Cl. .................................. 430/323; 430/162; 430/272; 430/330; 430/313; 430/317; 430/328
[58] Field of Search ............... 430/323, 162, 272, 330, 430/313, 317, 328

[56] References Cited

U.S. PATENT DOCUMENTS

4,738,916  4/1988  Namatsu et al. .................... 430/272

FOREIGN PATENT DOCUMENTS

| | | |
|---|---|---|
| 0069854A2 | 1/1983 | European Pat. Off. . |
| 00283666A2 | 9/1988 | European Pat. Off. . |
| 0315954 | 5/1989 | European Pat. Off. . |
| 5594955 | 7/1980 | Japan . |
| 56-49540 | 5/1981 | Japan . |
| 56-125855 | 10/1981 | Japan . |
| 57-154830 | 9/1982 | Japan .................................. 430/323 |
| 63-014432 | 1/1988 | Japan .................................. 430/323 |

OTHER PUBLICATIONS

W. S. DeForest, *Photoresist: Materials and Processes*, McGraw-Hill Book Co., New York, NY, 1975, pp. 55-61, 132-162, 244-246.

Walter Noll, *Chemistry and Technology of Silicones*, Academic Press, 1968, pp. 470-471 and 483-484.

*Primary Examiner*—Cynthia Hamilton
*Attorney, Agent, or Firm*—Oblon, Spivak, McClelland, Maier & Neustadt

[57] ABSTRACT

A method for transferring patterns on a silicone ladder type resin, which comprises: applying onto a substrate a silicone ladder type resin to be represented by the following general formula (I)

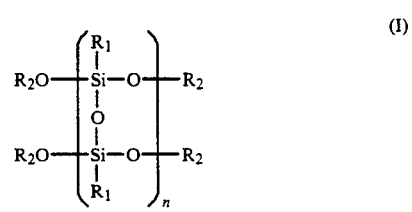

(where: $R_1$ denotes a phenyl group or a lower alkyl group, and two $R_1$'s may be the same or different kinds; $R_2$ denotes hydrogen atom or a lower alkyl group, and four $R_2$'s may be the same or different kinds; and n represents an integer of from 5 to 1,000); drying the thus applied resin layer; thereafter applying onto the resin layer a cresol novolac type positive photo-resist; forming a predetermined pattern in the photo-resist layer; subjecting the photo-resist layer to pretreatment; and finally etching the silicone ladder type resin.

An etching liquid for etching a silicone ladder type resin, which comprises an aromatic type solvent.

12 Claims, No Drawings

METHOD FOR TRANSFERRING PATTERNS ON SILICONE LADDER TYPE RESIN AND ETCHING SOLUTION USED IN SUCH METHOD

BACKGROUND OF THE INVENTION

1. Field of the Invention

This invention relates to a method for transferring patterns on a silicone ladder type resin, and to an etching solution used in such pattern transferring method.

2. Discussion of Background

In recent years, as a method for forming a passivation layer for a solid state element, a stress-relaxing film, or an insulating layer, in the production of semiconductor devices, studies have been made as to a method for spin-coating of high polymer materials having excellent properties such as lower residual stress, better surface smoothness, and higher purity than those of inorganic materials. As the high-polymer materials, there have so far been used thermo-setting resins such as silicone ladder type resins, polyimide resins, and so on having heat-resistance of 450° C. or higher.

When the above-mentioned silicone ladder type resin is used as a passivation layer for a solid-state element, a stress-relaxing layer, or an insulating layer, it becomes necessary to subject these silicone ladder type resin layers to fine machining in order to perforate through-holes for connecting them with the venting portions of the upper and lower conductor layers and with external lead wires.

For the purpose of subjecting a silicone ladder type resin film to fine machining, Japanese Unexamined Patent Publication No. 49540/1981 discloses a wet-type etching process, in which use is made of hydrofluoric acid as the etching liquid. When the present inventors examined workability of this etching liquid, it was found that a silicone ladder type resin could not be etched with hydrofluoric acid.

Also, Japanese Unexamined Patent Publication No. 125855/1981 discloses the dry etching process with use of CF4 gas plasma, which was also found to be disadvantageous in that its etching rate was low, and, in the case of a thick film such as a stress-relaxing layer, a passivation layer, and so on, its etching time was prolonged.

Thus, there has so far been established no technique of stable pattern transfer onto the thick layer of the silicone ladder type resin.

SUMMARY OF THE INVENTION

The present invention has been made with a view to solving the problems as mentioned above, and aims at providing a wet type etching method capable of stable pattern transfer in a short period of time even on a layer of a thick-film, and an etching liquid to be used for this etching process.

According to the present invention, in one aspect of it, there is provided a method for transferring patterns on a silicone ladder type resin, which comprises: applying onto a substrate a silicone ladder type resin to be represented by the following general formula (I)

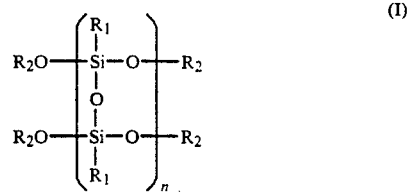

(where: $R_1$ denotes a phenyl group or a lower alkyl group, and two $R_1$'s may be the same or different kinds; $R_2$ denotes hydrogen atom or a lower alkyl group, and four $R_2$'s may be the same or different kinds; and n represents an integer of from 5 to 1,000); drying the thus applied resin layer; thereafter applying onto said resin layer a cresol novolac type positive photo-resist; forming a predetermined pattern in said photo-resist layer; subjecting said photo-resist layer to pre-etching treatment; and finally etching said silicone ladder type resin.

According to the present invention, in another aspect of it, there is provided an etching liquid for etching a silicone ladder type resin, which comprises an aromatic type solvent.

The foregoing objects, other objects as well as the specific conditions for effecting the method for etching according to the present invention and the ingredient constituting the etching liquid for use in effecting the method according to the present invention will become more apparent and understandable from the following detailed description thereof, when read in conjunction with the preferred examples.

DETAILED DESCRIPTION OF THE PREFERRED EMBODIMENTS

For effecting the etching method according to the present invention, there is used the silicone ladder type resin to be represented by the following general formula (I):

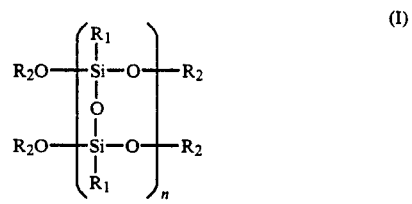

(where: $R_1$ denotes a phenyl group or a lower alkyl group such as methyl group, ethyl group and so forth, and two $R_1$'s may be the same or different kinds; $R_2$ denotes hydrogen atom or a lower alkyl group such as methyl group, ethyl group and so on, and four $R_2$'s may be the same or different kinds; and n represents an integer of from 5 to 1,0000, or preferably from 50 to 850).

This silicone ladder type resin is a well known one, of which a relatively high molecular weight resin and its production method are disclosed in Japanese Patent Publication No. 15989/1965, Japanese Unexamined Patent Publications No. 111197/1975, No. 111198/1975, and No. 18729/1982, and a relatively low molecular weight resin is available from Owens-Illinois Glass Co., U.S.A. as a glass resin. Both these high and low molecular weight resins can be used for the purpose of the present invention.

The coating film to be obtained from the silicone ladder type resin represented by the above general formula (I) has a smaller residual stress, better surface smoothness, and higher purity than those of inorganic materials, on account of which the resin material is suitable as a passivation layer of a solid-state element, a stress-relaxing film, insulating layer, and so forth.

According to the method of the present invention, the silicon ladder type resin to be represented by the general formula (I) is first coated onto a substrate, and then the coated resin is dried to remove a solvent contained in it, thereby forming the resin film.

It is desirable that the silicone ladder type resin be mixed with a solvent such as benzene type solvents, alkoxybenzene type solvents, N-methyl pyrrolidone, and so on the adjust its viscosity to an order of from 2,000 to 5,000 cps., and that, after this adjustment, the resin solution be applied onto a substrate such as silicon wafers, etc. by a spin-coating method using a spinner. While conditions for drying the resin solution as coated may differ from solvent to solvent, a preferred drying temperature range may be from 80° to 350° C., at which temperature level the resin does not become cured. A more preferred condition may be from 100° to 200° C. for 15 to 45 min.. Thickness of the resin film may usually be in a range of from 1 to 30 μm, although it may be varied depending on the purpose of its use.

In the next place, a cresol novolac type positive photo-resist is applied onto the above-mentioned dried, uncured resin film, and then a predetermined pattern is formed on this photo-resist layer.

As for the photo-resist layer, there is no particular limitation, and a cresol novolac type positive photo-resist available in general market may be used. Examples of the positive photo-resist material are: "OFPR-800" produced and marketed by Tokyo Ohka Kogyo K.K. (Tokyo Applied Chemical Industry Co. Ltd.), Japan, "AZ-1350" produced and marketed by Shipley Co., and other generally available photo-resist materials.

The photo-resist patterns ar formed by coating the above-mentioned phenol type positive photo-resist material onto the silicone ladder type resin by the spin-coating method in pursuance of the ordinary coating procedures, and, after close contact of a photo-mask, irradiating the ultra-violet rays onto the photo-resist layer, followed by developing the photoresist pattern.

Subsequently, there will be effected the following pretreatment with a view to suppressing occurrence of cracks in the photo-resist layer due to increase in the residual stress within the photo-resist layer by immersion into an etching liquid for the silicone ladder type resin at the time of its wet etching by use of the etching liquid to be explained later, with the thus obtained photo-resist pattern as a mask.

Examples of the pre-treatments are as follows:
(i) the photo-resist is heated to a temperature of from 125° to 160° C., or more preferably from 130 to 150° C for 15 to 60 min., or more preferably from 30 to 45 min., after which it is held at room temperature for three hours or longer, or more preferably for four hours or longer.
(ii) ultra-violet rays of 500 nm or lower, or more preferably from 300 to 500 nm are irradiated onto the entire surface of the photo-resist.

This pre-treatment was found out by the present inventors, as the results of their strenuous efforts, on the notion that the cracks to occur in the photo-resist layer might be suppressed by a method, in which a strength surpassing the internal stress of the photo-resist layer is imparted to it by the heat curing of the photo-resist layer, or a method, in which the photo-resist is liberated from its internal stress before it is immersed into the etching liquid.

The pre-treatment in the above (i), wherein the photo-resist layer is left at room temperature, was devised by the present inventors, who discovered, as the result of their studies on the pre-treatment of the photo-resist layer by the heat-treatment, that the conditions for occurrence of the cracks differed depending on length of time until it is immersed in the etching liquid after it is heated and then cooled to room temperature.

With the heating temperature in the pre treatment of the above (i) being below 125° C., the photo-resist layer does not become sufficiently cured, and the cracks tend to occur even when it is left to cool over a length of three hours or longer at room temperature after the heating. On the other hand, when the heating temperature exceeds 160° C., the photo-resist layer tends to suffer from heat deterioration. The heating time should be such that the photo-resist layer becomes sufficiently cured, which depends on the heating temperature. Usually, an appropriate time is selected from a range of between 15 and 60 min.. With a length of time, during which the photo-resist layer is left at room temperature (that is, a length of time from its return to room temperature after the heat-treatment to its immersion into the etching liquid) being less than three hours, the suppression of the cracks to occur is insufficient.

The suppression of the cracks to occur in the photo-resist layer by leaving it at room temperature after the heat-treatment appears to be due to the stress to be generated in the photo-resist layer by the linear expansion coefficient between the heat-cured photo-resist layer and the silicone ladder type resin being relaxed by maintaining the photo-resist layer at room temperature.

When the wavelength of the ultraviolet rays in the pre-treatment of the above (ii) exceeds 500 nm, a sufficient effect of irradiation of the ultraviolet rays becomes unable to be obtained. On the other hand, with the wavelength of the ultraviolet rays not reaching 300 nm, the effect of suppressing cracks to occur is not sufficient, even though the surface of the photo-resist layer becomes cured, hence, as is the case with the pre-treatment of the above-mentioned (i), it must be left at room temperature for at least 3 hours after the irradiation of the ultraviolet rays, whereby occurrence of the cracks can be suppressed.

While the quantity of irradiation of the ultraviolet rays depends upon the wavelength of the ultraviolet rays to be irradiated, a preferred intensity is 50 mJ/cm$^2$ or above. With the ultraviolet rays having the wavelength of from 300 to 500 nm, the intensity of its irradiation should preferably be 100 mJ/cm$^2$ or above. For suppressing the cracks to occur, the irradiating quantity of the ultraviolet rays should preferably be at such an intensity that the absorption peak in the vicinity of 2120 cm$^{-1}$ to be derived from the diazide group in the infrared ray absorption spectrum will disappear, i.e., 50 mJ/cm$^2$ or above. This appears to be due to the fact that the diazide group disappears by the irradiation of the ultraviolet rays, and, in particular, when the ultraviolet rays of the wavelength between 300 and 500 nm are irradiated, the diazide group is dissipated outside the photo-resist layer in the form of nitrogen gas to result in relaxation of the internal stress within the photo-resist layer, and it becomes softened.

As such, in the pre-treatment of the above (ii), by the irradiation of the ultraviolet rays having the wavelength of from 300 to 500 nm at its intensity of 100 mJ/cm$^2$ or above, there will occur no cracks in the photo-resist layer, even when it is immersed in the etching liquid immediately after the ultraviolet ray irradiation.

After the abovementioned pre-treatment, the silicone ladder type resin is etched with the photo-resist patterns as a mask.

The etching solution for the silicone ladder type resin should necessarily be those solvents which dissolve this resin but do not dissolve the phenolic type positive photo-resist layer. As the solvents for such resin, there have been known various types of solvents such as halogenated hydrocarbon type solvents, ether type solvents, benzene type solvents, alkoxybenzene type solvents, cyclic ketone type solvents, N-methylpyrrolidone, N,N'-dimethylformamide, and others (vide: Japanese Unexamined Patent Publication No. 4955/1980). As the results of making various studies on these solvents, the present inventors discovered that those aromatic type solvents such as benzene, alkylbenzene (toluene, xylene, and so on), and alkoxybenzene (methoxybenzene, ethoxybenzene, and so on) were suitable as the solvents which did not dissolve the phenolic type positive photo-resist layer. The rate of etching with these etching liquids should preferably be at an appropriate rate selected from a range between 1 and 10 $\mu$m/min. so as to complete the etching of the silicone ladder type resin in a time period of from 30 to 150 sec.. The adjustment of the etching rate can be done easily by mixing, for example, xylene, etc., depending upon the molecular weight of the silicone ladder type resin.

Preferred examples of the etching liquid are: a mixed solvent of alkoxybenzene and xylene with a volume ratio of the former being 18% or above, a mixed solvent of toluene and xylene with a volume ratio of the former being 20% or above, a mixed solvent of benzene and xylene with a volume ratio of the former being 25% or above, and others. The etching is usually done at a constant temperature level properly selected from a range between 20° and 28° C.

In the following, the present invention will be explained more specifically with reference to its preferred examples. It should however be noted that these examples are illustrative only and not so restrictive, and that any changes and modifications may be made by those persons skilled in the art in the treatment conditions, etc. without departing from the spirit and scope of the invention as recited in the appended claims.

EXAMPLE 1

To a silicone ladder type resin having a molecular weight of about 120,000, in which $R_1$ shown in the aforementioned general formula (I) is a phenyl group, and $R_2$ is hydrogen, there was added benzene to adjust the viscosity of the resin to 3,000 cps. Subsequently, the thus prepared solution was applied onto the surface of a silicon wafer by means of a spinner rotating at a rate of 2,000 rpm. Thickness of the film as formed was 10 $\mu$m.

The thus formed film layer was dried at a temperature of 150° C. for 30 min., after which a photo-resist material "OFPR-800" (a product of Tokyo Ohka Kogyo K.K.) was applied onto this resin layer by means of the spinner rotating at a rate of 2,000 rpm. Thickness of the photo-resist layer as formed was 2 $\mu$m.

After drying the photo-resist layer at a temperature of 80° C. for 30 min., a photo-mask was closely contacted on this photo-resist layer. Then, ultraviolet rays was irradiated onto it by means of an ultra-high pressure mercury lamp, followed by immersing the same in a developing liquid for "OFPR" for 60 sec. to thereby dissolve the exposed portion on the photo-resist. The thus developed photo-resist layer on the silicon wafer was rinsed with pure water, and then dried at a temperature of 80° C. for 30 min.. As the result, there was formed a photo-resist pattern.

Thereafter, the photo-resist layer was heat-treated at a temperature of 130° C. for 30 min., followed by maintaining the same at room temperature for four hours. Subsequently, the photo-resist layer was immersed in an etching liquid composed of a mixture of toluene and xylene with a volume ratio between them being 1/1 at 25° C. for 60 sec., thereby etching the silicone ladder type resin. After the etching, the thus treated photo-resist layer was observed through a microscope. No cracks were found to have occurred.

Next, the photo-resist layer was removed with use of a photo-resist release agent, thereby obtaining a silicone ladder type resin film, on which a predetermined pattern had been transferred. The size of the opening on the resin film was 24 $\mu$m square with a mask size of 20 $\mu$m square. Also, observation through a scanning electron microscope indicated that the result of the treatment was satisfactory.

EXAMPLE 2

Benzene was added to the silicone ladder type resin as used in Example 1 above to adjust the viscosity of the resin to 2,700 cps. The thus obtained resin solution was applied onto the silicon wafer by means of a spinner rotating at a rate of 2,000 rpm. Thickness of the layer as formed was 5 $\mu$m.

The resin layer as formed was dried at a temperature of 150° C. for 30 min., and then, following the same procedures as in Example 1 above, the photo-resist pattern having a pattern size of 20 $\mu$m square was formed.

After the heat-treatment at 140° C. for 30 min., the photo-resist pattern was held at room temperature for five hours. Subsequently, it was immersed in ethoxybenzene as the etching liquid at a temperature of 25° C. for 60 sec., thereby etching the silicone ladder type resin.

Next, the photo-resist layer was removed with use of a photo-resist release agent, thereby obtaining a silicone ladder type resin film, on which a predetermined pattern had been transferred. The size of the opening on the resin film was 23 $\mu$m square with a mask size of 20 $\mu$m square. Also, the shape of the pattern was satisfactory.

EXAMPLE 3

To a silicone ladder type resin having a molecular weight of about 150,000, in which $R_1$ shown in the afore-mentioned general formula (I) is a phenyl group, and $R_2$ is hydrogen, there was added toluene to adjust the viscosity of the resin to 5,000 cps. Subsequently, the prepared solution was applied onto the surface of a silicon wafer by means of a spinner rotating at a rate of 2,000 rpm. Thickness of the film as formed was 20 $\mu$m.

The resin layer as formed was dried at a temperature of 150° C. for 30 min., and then, following the same procedures as in Example 1 above, a photo-resist pattern having a pattern size of 20 $\mu$m square was formed.

Thereafter, ultraviolet rays at an intensity of 300mJ/cm² was irradiated over the entire surface of the photo-resist pattern by means of an ultra-high pressure mercury lamp, from which the rays of a wavelength shorter than 300 nm had been removed. After this, the photo-resist pattern was immersed in a mixed solvent of methoxybenzene and xylene with a volume ratio between them being ⅓, at a temperature of 25° C. for 60 sec. to etch the silicone ladder type resin. In the next place, the photo-resist layer was removed with use of a photo-resist release agent, thereby obtaining the silicone ladder type resin, on which a predetermined pattern had been transferred. The size of the opening on the resin film was 29 μm square. Also, the shape of the photo-resist pattern was found satisfactory.

EXAMPLE 4

To a silicone ladder type resin having a molecular weight of about 100,000, in which $R_1$ shown in the afore-mentioned general formula (I) is a methyl group and $R_2$ is hydrogen, there was added benzene to adjust the viscosity of the resin to 2,900 cps. Subsequently, the thus prepared solution was applied onto the surface of a silicon wafer by means of a spinner rotating at a rate of 2,000 rpm. Thickness of the film as formed was 8 μm.

The resin layer as formed was dried at a temperature of 140° C. for 30 min., and then, following the same procedures as in Example 1 above, the photo-resist pattern having a pattern size of 20 μm square was formed.

Thereafter, the photo-resist layer was heat-treated at a temperature of 150° C. for 30 min., followed by leaving the same at room temperature for ten hours. Subsequently, the photo-resist layer was immersed in a mixed solution of methoxybenzene and xylene with a volume ratio between them being ⅓ at 25° C. for 60 sec., thereby etching the silicone ladder type resin. After the etching, the thus treated photo-resist layer was observed through a microscope. No cracks were found to have occurred.

Next, the photo-resist layer was removed with use of a photo-resist release agent to thereby obtain the silicone ladder type resin, on which a predetermined pattern had been transferred. The size of the opening on the resin film was 23 μm square. Also, the shape of the photo-resist pattern was found satisfactory.

EXAMPLE 5

Benzene was added to the silicone ladder type resin as used in Example 4 above to adjust the viscosity of the resin to 2,400 cps. The thus obtained resin solution was applied onto a silicon wafer by means of a spinner rotating at a rate of 2,000 rpm. Thickness of the layer as formed was 3.0 pm.

The resin layer as formed was dried at a temperature of 140° C. for 30 min., and then, following the same procedures as in Example 1 above, the photo-resist pattern having a pattern size of 10 μm square was formed. Thereafter, the ultraviolet rays at an intensity of 200 mJ/cm² was irradiated over the entire surface of the photo-resist pattern by means of an ultra-high pressure mercury lamp, from which the rays of a wavelength shorter than 300 nm had been removed. After this, the photo-resist pattern was immersed in ethoxybenzene at a temperature of 25° C. for 30 sec., whereby etching the silicone ladder type resin. In the next place, the photo-resist layer was removed with use of a photo-resist release agent to thereby obtain the silicone ladder type resin, on which a predetermined pattern had been transferred. The size of the opening on the resin film was 10.9 μm square. Also, the shape of the photo-resist pattern was found satisfactory.

EXAMPLE 6

Benzene was added to the silicone ladder type resin as used in Example 1 above to adjust the viscosity of the resin to 2,800 cps. The thus obtained resin solution was applied onto a silicon wafer by means of a spinner rotating at a rate of 2,000 rpm. Thickness of the layer as formed was 6 μm. Subsequently, following the same procedures as in Example 1 above, a photo-resist pattern having a size of 10 μm square was formed, after which the ultraviolet rays at an intensity of 200 mJ/cm² were irradiated over the entire surface of the photo-resist pattern, and then it was maintained at room temperature for five hours.

Subsequently, the photo-resist pattern was immersed in a mixed solvent of toluene and xylene with a volume ratio between them being ⅔ as the etching liquid, at a temperature of 25° C. for 50 sec., thereby etching the silicone ladder type resin. After the etching, the thus treated photo-resist was observed through a microscope. No cracks were found to have occurred.

Next, the photo-resist layer was removed with use of a photo-resist release agent to thereby obtain the silicone ladder type resin, on which a predetermined pattern had been transferred. The size of the opening on the resin film was 12.5 μm square with the photo-resist pattern having a mask size of 10 μm square.

EXAMPLE 7

A benzene solution of the silicone ladder type resin as used in Example 4 above was applied on a silicon wafer by means of a spinner rotating at a rate of 3,000 rpm. Thickness of the resin layer as formed was 5.0 μm.

The resin layer as formed was dried at a temperature of 140° C. for 30 min., and then, following the same procedures as in Example 1 above, the photo-resist pattern having a pattern size of 10 μm square was formed. Thereafter, the ultraviolet rays at an intensity of 250 mJ/cm² was irradiated over the entire surface of the photo-resist pattern by means of an ultra-high pressure mercury lamp, from which the rays of a wavelength shorter than 300 nm had been removed.

After this, the photo-resist pattern was immersed in a mixed solution of toluene and xylene with a volume ratio between them being ⅔ as the etching liquid, at a temperature of 25° C. for 50 sec., thereby etching the silicone ladder type resin. After the etching, there could be found no cracks occurred in the photo-resist pattern.

In the next place, the photo-resist layer was removed with use of a photo-resist release agent to thereby obtain the silicone ladder type resin, on which a predetermined pattern had been transferred. The size of the opening on the resin film was 13.0 μm square with the photo-resist pattern having a mask size of 10 μm square.

As has so far been described in the foregoing, according to the present invention, it is possible to etch the silicone ladder type resin in a short period of time with use of an aromatic type solvent, and to transfer a predetermined pattern with satisfaction.

What is claimed is:

1. A method for transferring patterns onto a silicone ladder type resin, which comprises:

applying onto a substrate a silicone ladder type resin to be represented by formula (I)

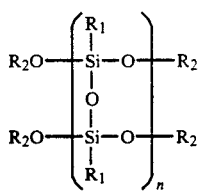

wherein $R_1$ denotes a phenyl group or a lower alkyl group, and the two $R_1$'s may be the same or different; $R_2$ denotes a hydrogen atom or a lower alkyl group, and the four $R_2$'s may be the same or different; and n represents an integer of from 5 to 1,000;

drying the thus applied resin layer;

thereafter applying onto said resin layer a cresol novolac type positive photo-resist;

forming a predetermined pattern in said photo-resist layer;

subjecting said photo-resist layer to stress-relieving pretreatment; and finally etching said silicone ladder type resin, wherein said pretreatment is effected by heating said photo-resist layer at a temperature ranging from 126° to 160° C. for 15 to 60 min., and maintaining said photo-resist layer at room temperature for three hours or longer.

2. A method according to claim 1, wherein said pretreatment is effected by heating said photo-resist layer at a temperature ranging from 130° to 150° C. for 30 to 45 min., and maintaining said photo-resist layer at room temperature for four hours or longer.

3. A method for transferring patterns onto a silicone ladder type resin, which comprises:

applying onto a substrate a silicon ladder type resin to be represented by formula (I)

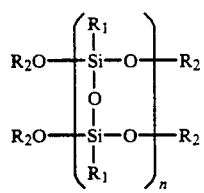

wherein $R_1$ denotes a phenyl group or a lower alkyl group, and the two $R_1$'s may be the same or different; $R_2$ denotes a hydrogen atom or a lower alkyl group, and the four $R_2$'s may be the same or different; and n represents an integer of from 5 to 1,000;

drying the thus applied resin layer;

thereafter applying onto said resin layer a cresol novolac type positive photo-resist;

forming a predetermined pattern in said photo-resist layer;

subjecting said photo-resist layer to stress-relieving pretreatment; and finally etching said silicone ladder type resin, wherein said pretreatment is effected by irradiating with ultraviolet rays having a wavelength of 500 nm or below over the entire surface of said photo-resist layer.

4. A method according to claim 1, wherein an irradiating quantity of said ultraviolet rays is 50 mJ/cm² or above.

5. A method according to claim 1, wherein said pretreatment is effected by irradiating ultraviolet rays having a wavelength of from 300 to 500 nm over the entire surface of said photo-resist layer.

6. A method according to claim 5, wherein an irradiating quantity of said ultraviolet rays is 100 mJ/cm² or above.

7. A method according to claim 1 or claim 3, wherein a temperature for said etching is in a range of from 20° to 28° C.

8. A method according to claim 1 or claim 3, wherein a rate of said etching is in a range of from 1 to 10 μm/min.

9. A method according to claim 1 or claim 3, wherein the silicone ladder type resin is etched with an etching liquid comprising an aromatic type solvent.

10. A method according to claim 1, wherein said etching liquid is selected from the group consisting of benzene, alkylbenzene, alkoxybenzene and a mixture of any of these solvents.

11. A method according to claim 1, wherein the etching liquid is selected from the group consisting of benzene, toluene, xylene, methoxybenzene, ethoxybenzene, and a mixture of any of these solvents.

12. A method according to claim 1, wherein the etching liquid is selected from the group consisting of a mixed solvent of alkoxybenzene and xylene with a volume ratio of the former being 18% or above; a mixed solvent of toluene and xylene with a volume ratio of the former being 20% or above; and a mixed solvent of benzene and xylene with a volume ratio of the former being 25% or above.

* * * * *